United States Patent [19]

Kanuma

[11] Patent Number: 4,656,370
[45] Date of Patent: Apr. 7, 1987

[54] INTEGRATED CIRCUIT WITH DIVIDED POWER SUPPLY WIRING

[75] Inventor: Akira Kanuma, Yokohama, Japan

[73] Assignee: Kabushiki Kaisha Toshiba, Kawasaki, Japan

[21] Appl. No.: 634,028

[22] Filed: Jul. 24, 1984

[30] Foreign Application Priority Data

Jul. 28, 1983 [JP] Japan ................................. 58-138311

[51] Int. Cl.$^4$ .............................................. H01L 23/50
[52] U.S. Cl. ................................. 307/303; 307/200 A; 307/219; 307/296 R; 357/68
[58] Field of Search ............... 307/200 A, 200 B, 441, 307/443, 219, 246, 296 R, 297, 303; 357/68, 74

[56] References Cited

U.S. PATENT DOCUMENTS

| | | | |
|---|---|---|---|
| 3,808,475 | 4/1974 | Buelow et al. | 357/68 X |
| 3,866,066 | 2/1975 | Pedersen | 307/466 X |
| 3,968,478 | 7/1976 | Mensch, Jr. | 307/303 X |
| 4,023,053 | 5/1977 | Shimuzu et al. | 307/303 X |
| 4,278,897 | 7/1981 | Ohno et al. | 307/455 |
| 4,482,820 | 11/1984 | Kohsiek | 307/303 |
| 4,508,981 | 4/1985 | Dorler et al. | 307/303 X |
| 4,583,111 | 4/1986 | Early | 307/303 X |

Primary Examiner—Larry N. Anagnos
Assistant Examiner—D. R. Hudspeth
Attorney, Agent, or Firm—Finnegan, Henderson, Farabow, Garrett & Dunner

[57] ABSTRACT

An integrated circuit (IC) of the invention is provided with a plural sets of power supply and ground lines within a package of the IC. Circuit elements, e.g., output buffers in the IC are divided into plural groups and each buffer group is coupled to the corresponding set of the power supply and ground lines. Each set of the power supply and ground lines is provided with independent wirings so that the magnitude of current change in each wiring and the value of each wiring inductance become small.

5 Claims, 6 Drawing Figures

INTEGRATED CIRCUIT WITH DIVIDED POWER SUPPLY WIRING

BACKGROUND OF THE INVENTION

This invention relates to an integrated circuit (IC), particularly to an improvement regarding the power supply bus of a semiconductor digital IC having numerous external pins.

FIG. 1 shows a conventional internal configuration of a semiconductor digital IC having numerous external pins. In Fig.1, a numeral 101 denotes a package enclosing a semiconductor IC chip 102; numerals 103-1 to 103-M denote data input pads being provided on IC chip 102; a numeral 104 denotes an input circuit of IC; a numeral 105 denotes an internal digital circuit of IC; numerals 106-1 to 106-N denote output buffers which amplify output signals from internal circuit 105 and provide the amplified signals to pads 107-1 to 107-N; a numeral 109 denotes a ground pad connected to a ground potential line; a numeral 113 denotes a power supply pad connected to a power supply potential line; a numeral 111 denotes an external pin connected to pad 109; a numeral 115 denotes an external pin connected to pad 113; numerals 108-1 to 108-N denote self-inductances of the ground potential line; numerals 112-1 to 112-N denote self-inductances of the power supply potential line; a numeral 110 denotes a self-inductance of the wiring between pad 109 and pin 111; a numeral 114 denotes a self-inductance of the wiring between pad 113 and pin 115; numerals 116-1 to 116-M denote external pins respectively connected to pads 103-1 to 103-M; and numerals 117-1 to 117-N denote external pins respectively connected to pads 107-1 to 107-N. The power supply potential line and the ground potential line of each of circuits 104 and 105 are connected to pads 113 and 109, respectively.

The conventional configuration as shown in FIG. 1 involves following disadvantage.

Now, consideration will be given to a case wherein the output from buffer 106-1 is changed between a "0" level corresponding to the ground potential and a "1" level corresponding to the power supply potential. When the output level of buffer 106-1 is changed from "0" to "1", a current, which flows from pin 115 to pin 117-1 via elements 114, 113, 112-N to 112-1, 106-1 and 107-1, increases so that the potential at pin 117-1 rises to the "1" level potential. On the other hand, when the output level of buffer 106-1 is changed from "1" to "0", a current, which flows from pin 117-1 to pin 111 via elements 107-1, 106-1, 108-1 to 108-N, 109 and 110, increases so that the potential at pin 117-1 falls into the "0" level potential. Similar current increase appears in the current paths of the above elements when the output level of any of buffers 106-2 to 106-N is changed.

When a current change appears in a current path, the following counter electromotive force E is induced:

$$E = -L \, dI/dt \qquad (1)$$

where L denotes a self-inductance of the current-path and dI/dt denotes a current change rate per unit time. Thus, counter electromotive force is inevitably induced, with output level changes, due to self-inductances 112-1 to 112-N, 108-1 to 108-N, 114 and 110 in the IC. This induced counter electromotive force produces harmful noises (switching noises) around the power supply and ground potential lines. Although the produced noises are less harmful to the circuit operation of the IC if only a small number of output buffers change their output levels, such noises become harmful when almost all output levels of numerous buffers 106-1 to 106-N are changed similarly.

SUMMARY OF THE INVENTION

It is accordingly the object of the present invention to provide an integrated circuit which can practically avoid noise problems due to the above induced counter electromotive force of power supply and ground lines.

To achieve the above object an integrated circuit of the invention is provided with a plural sets of power supply and ground lines within the integrated circuit. Circuit elements, e.g., output buffers of the integrated circuit are divided into plural groups and each buffer group is coupled to the corresponding set of the power supply and ground lines.

For example, it is assumed that the integrated circuit has 128 output buffers and these buffers are divided into 8 groups each including 16 output buffers. Then, 8 sets of power supply and ground lines are coupled to the 8 buffer groups, respectively. It is further assumed that the output level change of each buffer in the buffer group brings a transient current change rate of, e.g., 10 mA/nS in the power supply and ground lines. In this case, when all output levels of each buffer group are changed similarly, a transient current change of rate 160 mA/nS (=10 mA/nS ×16) appears at the corresponding set of power supply and ground lines. On the other hand, according to a conventional configuration as shown in FIG. 1, if all output levels of 128 buffers are changed similarly, a transient current change of rate 1280 mA/nS (=10 mA/nS ×128) appears at the power supply and ground lines. Further, generally speaking, the wiring inductance for 16 buffers can be made smaller than that for 128 buffers. As seen from Eq. (1), the magnitude of noises due to counter electromotive force E is proportional to the product of the wiring inductance (L) and the current change rate (dI/dt). Accordingly, noises produced at each set of the power supply and ground lines of the present invention become far smaller than those produced in the conventional configuration. The combination of a small wiring inductance (L) and a small current change rate (dI/dt) effectively reduces noises due to counter electromotive force E.

DETAILED DESCRIPTION TO THE PREFERRED EMBODIMENTS

Figure 2:
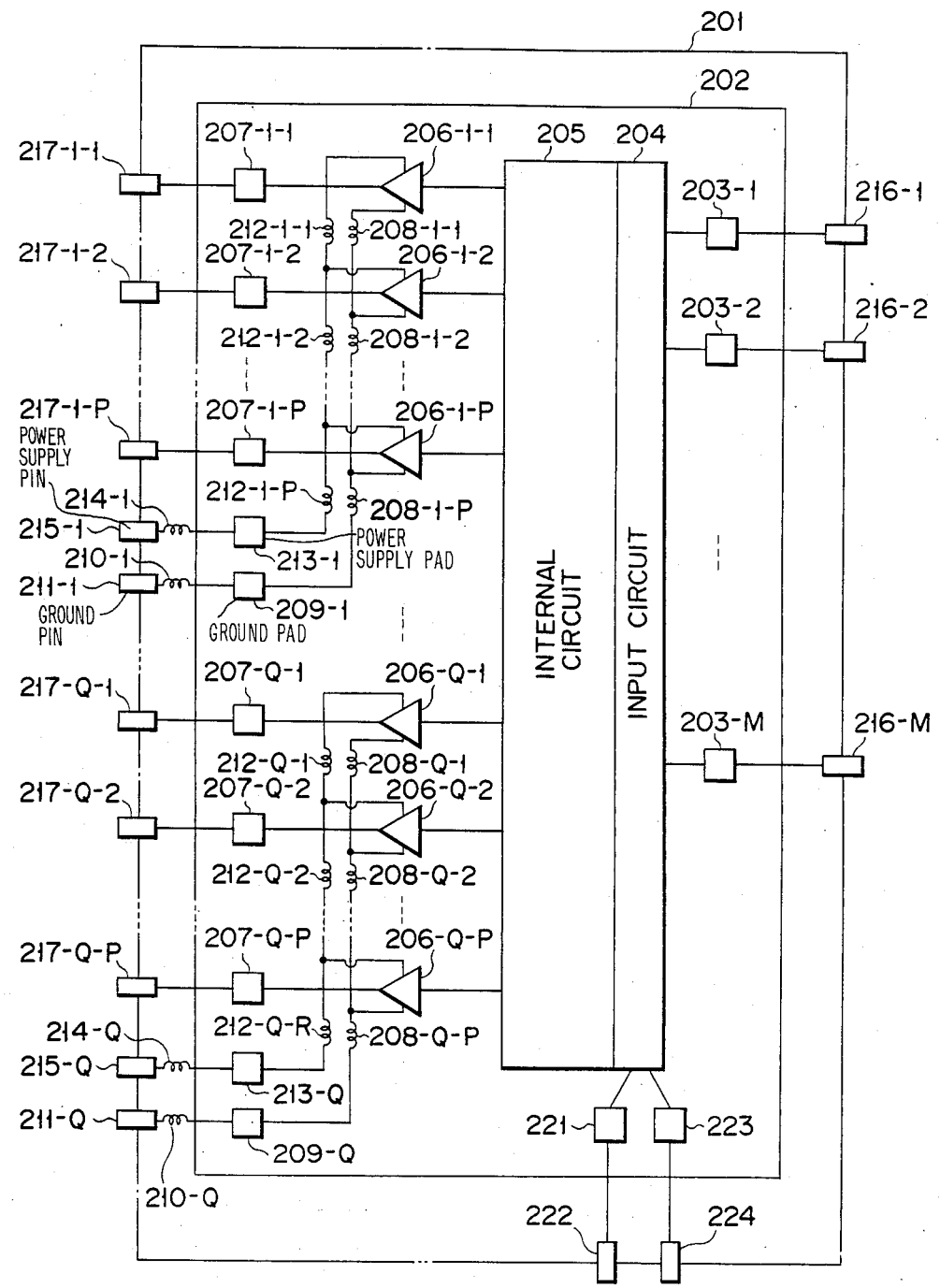
FIG. 2 shows an internal configuration of a semiconductor IC according to an embodiment of the present invention.

FIG. 2 shows an internal configuration of a semiconductor IC according to an embodiment of the present invention. In FIG. 2, a package 201 contains a semiconductor IC chip 202. IC chip 202 includes an internal digital circuit 205 being provided with an input circuit 204. Input circuit 204 is coupled respectively via input pads 203-1 to 203-M to input pins 216-1 to 216-M mounted on the periphery of package 201. The power supply line of input circuit 204 is connected via a power supply pad 221 to a power supply pin 222 mounted on the periphery of package 201, and the ground line thereof is connected via a ground pad 223 to a ground pin 224 mounted on the periphery of package 201.

Internal circuit 205 is coupled to output buffers 206-1-1 to 206-Q-P. These output buffers are divided into Q groups. Each group of output buffers includes P buffers (e.g., 206-1-1 to 206-1-P). Total number of output buffers 206-1-1 to 206-Q-P is M, i.e., P×Q =M (e.g., P =16, Q =8 and M =128).

The power supply line of the first group buffers 206-1-1 to 206-1-P is connected to a power supply pad 213-1 via wirings with self-inductances 212-1-1 to 212-1-P, and the ground line thereof is connected to a ground pad 209-1 via wirings with self-inductances 208-1-1 to 208-1-P. Pad 213-1 is connected via a wiring with a self-inductance 214-1 to a power supply pin 215-1 which is mounted on the periphery of package 201, and pad 209-1 is connected via a wiring with a self-inductance 210-1 to a ground pin 211-1 wich is mounted on the periphery of package 201.

Similarly, the power supply line of the Q th group buffers 206-Q-1 to 206-Q-P is connected to a power supply pad 213-Q via wirings with self-inductances 212-Q-1 to 212-Q-P, and the ground line thereof is connected to a ground pad 209-Q via wirings with self-inductances 208-Q-1 to 208-Q-P. Pad 213-Q is connected via a wiring with a self-inductance 214-Q to a power supply pin 215-Q which is mounted on the periphery of package 201, and pad 209-Q is connected via a wiring with a self-inductance 210-Q to a ground pin 211-Q which is mounted on the periphery of package 201.

The output circuits of the first group buffers 206-1-1 to 206-1-P are respectively coupled via output pads 207-1-1 to 207-1-P to output pins 217-1-1 to 217-1-P which are mounted on the periphery of package 201. Similarly, the output circuits of the Q th group buffers 206-Q-1 to 206-Q-P are respectively coupled via output pads 207-Q-1 to 207-Q-P to output pins 217-Q-1 to 217-Q-P which are mounted on the periphery of package 201.

Figure 1:
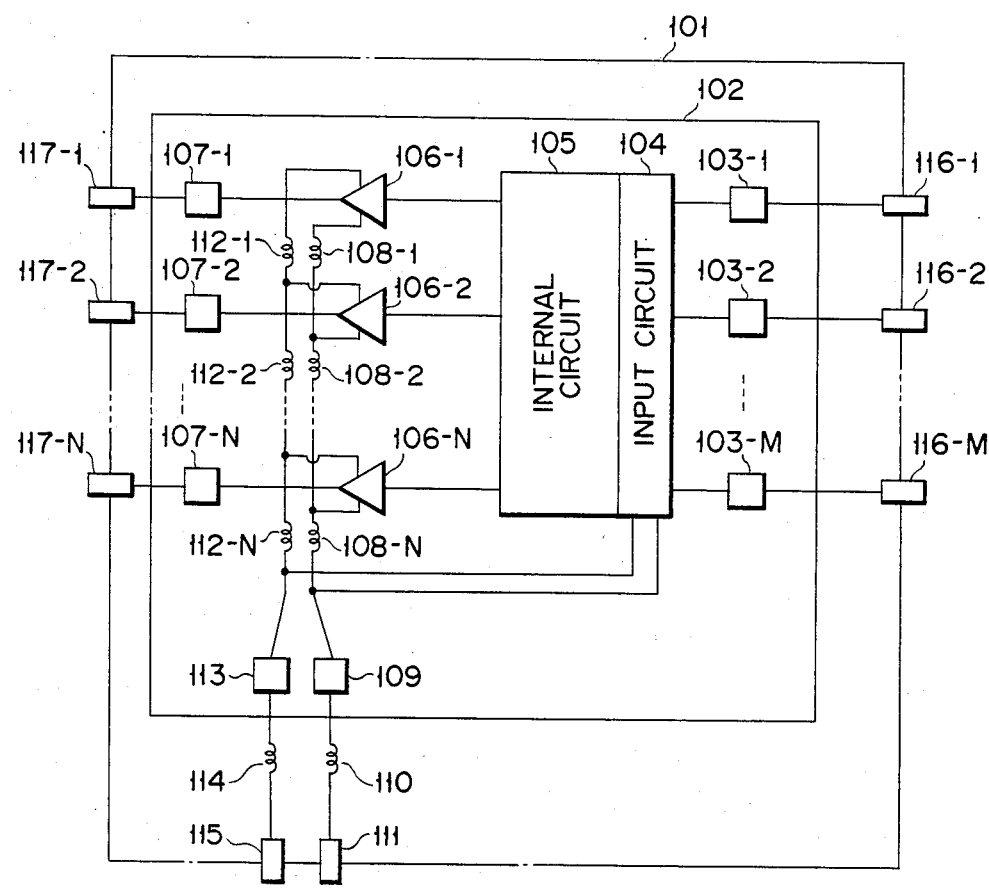
FIG. 1 shows a conventional internal configuration of a semiconductor IC having numerous external pins.

Assume here that the total number M of output buffers 206-1-1 to 206-Q-P in FIG. 2 is the same as the number N of output buffers 106-1 to 106-N in FIG. 1, and that the IC manufacturing process of FIG. 2 is the same as the IC manufacturing process of FIG. 1. Under this assumption, since N =M >P, the total wiring inductance of FIG. 2 configuration from pads 215-1, 211-1 (or 215-Q, 211-Q) to the most distanced buffer 206-1-1 (or 206-Q-1) becomes smaller than that of FIG. 1 configuration from pads 115, 111 to the most distanced buffer 106-1. (In other words, the values of inductances 214-1, 212-1-P to 212-1-1, 210-1 and 208-1-P to 208-1-1 are the same as those of inductances 114, 112-N to 112-(N-P+1), 110 and 108-N to 108-(N-P+1), respectively.) Further, the current flowing through the wiring inductance of FIG. 2 becomes smaller than that of FIG. 1 because P <N. (For instance, in case where all buffer outputs change from "1" to "0" or from "0" to "1", the magnitude of current change of inductances 214-1, 212-1-P to 212-1-1, 210-1 and 208-1-P to 208-1-1 in FIG. 2 becomes smaller than that of inductances 114, 112-N to 112-(N-P+1), 110 and 108-N to 108-(N-P+1).) Accordingly, switching noises of FIG. 2 due to counter electromotive force E of Eq. (1) can be sufficiently smaller than the noise of FIG. 1.

Pads 221, 223 and pins 222, 224 provided on package 201 are independently prepared and are intentionally separated from the pads and pins for buffers 206-1-1 to 206-Q-P. From this, input circuit 204 can be free from influence of switching noises caused by the output level changes of buffers 206-1-1 to 206-Q-P.

Figure 3:
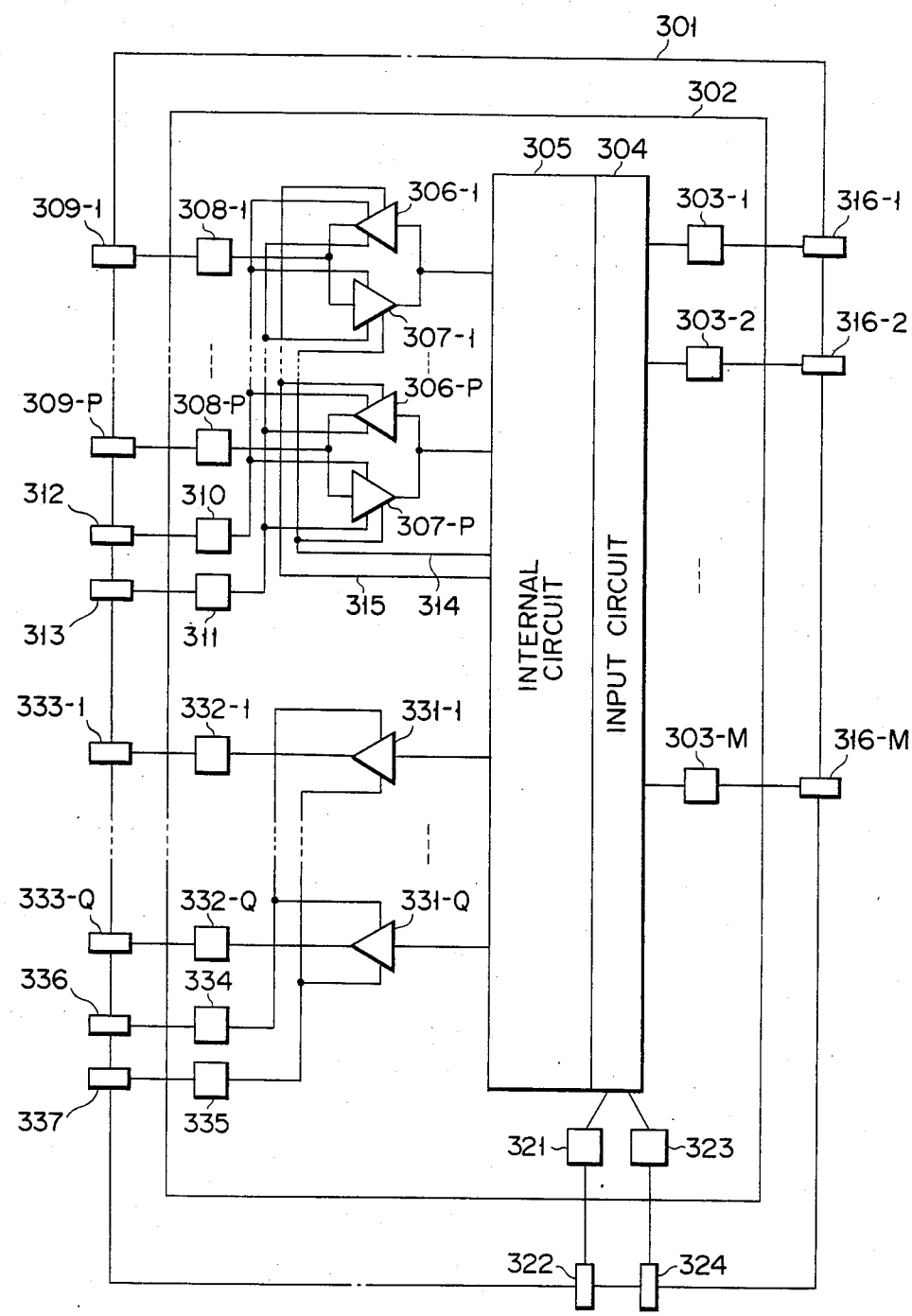
FIG. 3 shows an internal configuration of a semiconductor IC according to another embodiment of the present invention.

FIG. 3 shows an internal configuration of a semiconductor IC according to another embodiment of the present invention. In FIG. 3, output buffers 306-1 to 306-P and input buffers 307-1 to 307-P are provided in an IC chip 302 which is mounted in a package 301. Buffers 306-1 and 307-1 constitute a pair of input/output buffers which selectively serves as an input buffer or an output buffer. Other buffer pairs 306-2 & 307-2 to 306-P & 307-P constitute similar input/output buffers. P pairs of input/output buffers 306-1 & 307-1 to 306-P & 307-P are connected to an internal circuit 305 being provided with an input circuit 304. Pins 309-1 to 309-P are respectively connected via pads 308-1 to 308-P to the input-/output circuits of these buffer pairs 306-1 & 307-1 to 306-P & 307-P. The power supply line of each of these buffer pairs is connected via a pad 310 to a pin 312, and the ground line thereof is connected via a pad 311 to a pin 313. M input pins 316-1 to 316-M are respectively connected to input circuit 304 via pads 303-1 to 303-M. The power supply line of input circuit 304 is connected via a pad 321 to a pin 322 and the ground line thereof is connected via a pad 323 to a pin 324.

Output buffers 306-1 to 306-P are responsive to a control signal 315 supplied from internal circuit 305. The logic level of signal 315 is, e.g., "1" when these output buffers are enabled, and is "0" when they are disenabled. When enabled, buffers 306-1 to 306-P provide output data to pins 309-1 to 309-P. When disenabled, the output circuit impedance of buffers 306-1 to 306-P becomes high and they stop to provide output data. (I.e., output buffers 306-1 to 306-P are 3-state buffers.) Input buffers 307-1 to 307-P are responsive to a control signal 314 supplied from internal circuit 305. The logic level of signal 314 is, e.g., "1" when these input buffers are enabled, and is "0" when they are disenabled. When enabled, buffers 307-1 to 307-P transfer input data from pins 309-1 to 309-P to internal circuit 305. When disenabled, buffers 307-1 to 307-P stop the input data transfer.

Connected also to internal circuit 305 are output buffers 331-1 to 331-Q. Buffers 331-1 to 331-Q amplify signals from circuit 305 and supply them to pins 333-1 to 333-Q via pads 332-1 to 332-Q. The power supply line of these buffers is connected via a pad 334 to a pin 336, and the ground line of these buffers is connected via a pad 335 to a pin 337.

Incidentally, wiring inductances as shown in FIG. 1 or 2 are omitted from the illustration in FIG. 3 for the sake of simplicity.

According to the configuration of FIG. 3, the power supply and ground lines of input/output buffers 306-1 & 307-1 to 306-P & 307-P, the power supply and ground lines of output buffers 331-1 to 331-Q and the power supply and ground lines of input circuit 304 are separated from one another. Therefore, input circuit 304 is free from switching noises due to wiring inductances of output buffers 331-1 to 331-Q and/or output buffers 306-1 to 306-P. Thus, even if all outputs from buffers 306-1 to 306-P and 331-1 to 331-Q similarly change (from "0" to "1" or vice versa), no erroneous operation caused by the switching noises occurs. Also, in case where input/output buffers 306-1 & 307-1 to 306-P & 307-P serve as input buffers, input buffers 307-1 to 307-P are free from switching noises due to wiring inductances of output buffers 331-1 to 331-Q.

The embodiments of FIGS. 2 and 3 are designed to prevent influence of switching noises which are caused by current changes in the wiring inductances, where output buffers drives heavy external loads (particularly large capacitive loads) connected to the output pins. The concept of these embodiments may be applied to inner circuits of the IC which are designed to drive heavy inner load elements such as memory cells of a dynamic RAM.

Figure 4:
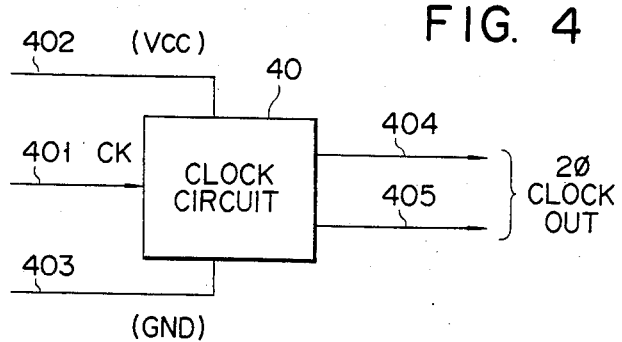
FIG. 4 shows a 2-phase clock circuit whose power supply and circuit ground lines are separated from those lines for another circuit in the same IC.

FIG. 4 shows a 2-phase clock circuit 40 whose power supply line 402 and ground line 403 are separated from the power supply and ground lines for another circuit (not shown) in the same IC. Circuit 40 generate 2-phase clocks 404 and 405 according to a clock input 401. When heavy loads are coupled to the 2-phase clock lines of circuit 40, large current change appears at lines 402 and 403. However, since these lines 402 and 403 are separated from the power supply and ground lines of another circuit, this another circuit avoids influence of switching noises caused by the current change in lines 402 and 403.

Figure 5:
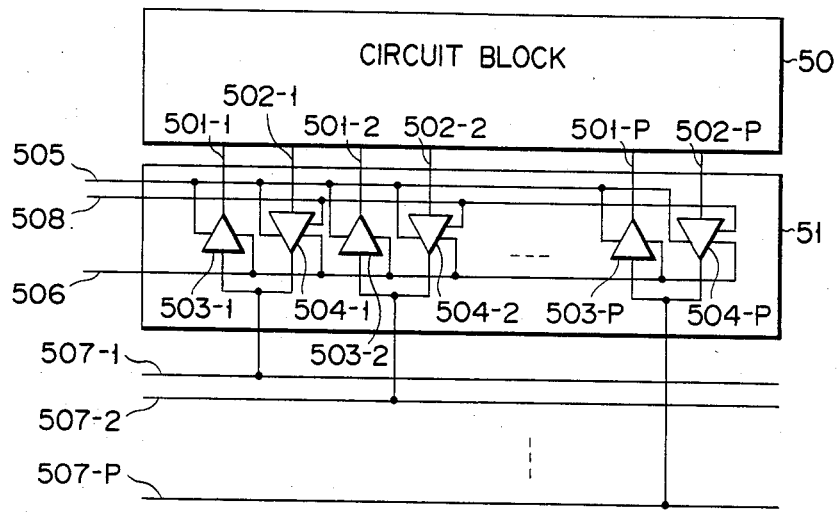
FIG. 5 shows input/output buffers for an inner circuit block, power supply and circuit ground lines of which are separated from those lines for another circuit in the same IC.

FIG. 5 shows input 3-state buffers 503-1 to 503-P and output 3-state buffers 504-1 to 504-P for an inner circuit block 50. Output circuits 501-1 to 501-P of input buffers 503-1 to 503-P are connected to input circuits of block 50. Input circuits 502-1 to 502-P of output buffers 504-1 to 504-P are connected to output circuits of block 50. These input/output buffers form buffer pairs 503-1 & 504-1 to 503-P & 504-P, and these buffer pairs are respectively connected to data buses 507-1 to 507-P. A power supply line 505 and ground line 506 of these input/output buffers are connected to independent wire-bonding pads (not shown) which are exclusively provided for these lines, and lines 505 and 506 are separated from power supply and ground lines for circuit block 50 etc. Output 3-state buffers 504-1 to 504-P are controlled by a control signal on a control line 508. When the logical level of the control signal is, e.g., "0", buffers 504-1 to 504-P stop to provide output data and their output impedances become high. In general, heavy capacitive loads are coupled to buses 507-1 to 507-P, and large current change for charging or discharging the heavy capacitive loads appears on these buses when all address data are similarly changed. However, since power supply and ground lines 505 and 506 are separated from the power supply and ground lines of another circuit, this another circuit avoids influence of switching noises caused by the current change in the address buses.

Figure 6:
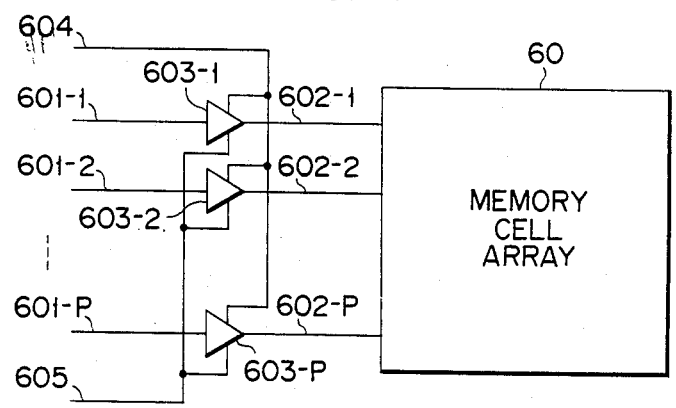
FIG. 6 shows address buffers for driving the word lines of a memory cell array, wherein the power supply and circuit ground lines of these buffers are separated from those lines for another circuit in the same IC.

FIG. 6 shows address buffers 603-1 to 603-P for driving word lines 602-1 to 602-P of a memory cell array 60. Inputs of buffers 603-1 to 603-P are respectively connected to address lines 601-1 to 601-P. A power supply line 604 and ground line 605 of buffers 603-1 to 603-P are connected to independent wire-bonding pads (not shown) which are exclusively provided for lines 604 and 605. Lines 604 and 605 are separated from power supply and ground lines for memory cell array 60 etc. in the same IC. Generally speaking, word lines 602-1 to 602-P of the memory (RAM, ROM, CCD, etc.) are heavy capacitive loads, and large current change for charging or discharging the heavy capacitive loads appears on word lines 602-1 to 602-P when all read-out or write-in data are similarly changed. However, since power supply and ground lines 604 and 605 are separated from the power supply and ground lines of another circuit (not shown), this another circuit avoids influence of switching noises caused by the current change in the word lines.

According to the present invention, since the power supply and ground lines in an IC are divided into plural sets and each set is provided with independent wirings, the magnitude of current change in each wiring and the value of each wiring inductance can be made small. From this, switching noises caused by simultaneous similar data change can be suppressed, thereby avoiding erroneous operation.

The present invention is not limited to the embodiments as described above. Various changes and modifications may be made within the scope of the invention defined by the appended claims.

What is claimed is:

1. An integrated circuit with divided power supply wiring, comprising:
   a plurality of sets of power lines, each of said sets being formed of a power supply line and a ground line;
   a plurality of groups of integrated circuit output circuit elements formed in the integrated circuit, each of said groups being respectively coupled to one of said power line sets; and
   an input circuit containing a plurality of integrated circuit input circuit elements formed in the integrated circuit, said input circuit being coupled to a power line sets coupled to said groups.

2. An integrated circuit according to claim 1, comprising a plurality of binding pads and wherein each of said power supply and ground lines is connected to separate ones of said bonding pads 3. An integrated circuit according to claim 2, comprising a package housing said input and output circuit elements and a plurality of external pins provided at the periphery of said package wherein said bonding pads are respectively connected to said external pins.

4. An integrated circuit according to claim 1, comprising first and second groups of bonding pads and wherein each of said power supply and round lines connected to said integrted circuit output circuit elements is connected to separate ones of said first group of bonding pads, and each of said power supply and ground lines connected to said integrated circuit input circuit elements is connected to separate ones of said second group of bonding pads.

5. An integrated circuit according to claim 4, comprising a package housing said integrated circuit input and output circuit elements, and a plurality of external pins provided at the periphery of said package, wherein each of said bonding pads is respectively connected to separate ones of said external pins.

* * * * *